United States Patent [19]

DeLong et al.

[11] Patent Number: 5,045,483

[45] Date of Patent: Sep. 3, 1991

[54] SELF-ALIGNED SILICIDED BASE BIPOLAR TRANSISTOR AND RESISTOR AND METHOD OF FABRICATION

[75] Inventors: Bancherd DeLong; Christopher S. Blair; George E. Ganschow; Thomas S. Crabb, all of Puyallup, Wash.

[73] Assignee: National Semiconductor Corporation, Santa Clara, Calif.

[21] Appl. No.: 503,340

[22] Filed: Apr. 2, 1990

[51] Int. Cl.⁵ .......................................... H01L 21/328
[52] U.S. Cl. ...................................... 437/31; 437/162; 437/238; 437/200; 437/918; 148/DIG. 123
[58] Field of Search ................... 437/31, 33, 162, 238, 437/200, 60, 918; 148/DIG. 123, DIG. 125, DIG. 19, DIG. 147, DIG. 124; 357/34

[56] References Cited

U.S. PATENT DOCUMENTS

| | | | |
|---|---|---|---|
| 3,955,269 | 5/1976 | Magdo et al. | 437/31 |
| 4,484,388 | 11/1984 | Iwasaki | 437/31 |
| 4,507,847 | 4/1985 | Sullivan | 437/31 |
| 4,536,945 | 8/1985 | Gray et al. | 437/31 |
| 4,609,568 | 9/1986 | Koh et al. | 437/31 |
| 4,764,480 | 8/1988 | Vora | 437/31 |
| 4,795,722 | 1/1989 | Welch et al. | 437/192 |
| 4,829,025 | 5/1989 | Iranmanesh | 437/228 |
| 4,897,364 | 1/1990 | Nguyen | 437/69 |

OTHER PUBLICATIONS

Brassington et al., "An Advanced Single-Level Polysilicon Submicrometer BiCMOS Technology", *IEEE Trans. Elect. Devices,* vol. 36, No. 4, Apr. 1989, pp. 712–719.

Momose et al., "1 μm n-well CMOS/Bipolar Technology", *IEDM Transactions on Electron Devices,* vol. ed-32, No. 2, Feb. 1985, pp. 217–223.

Kapoor, et al., "A High Speed High Density Single-Poly ECL Technology for Linear/Digital Applications", *IEEE 1985 Custom Integrated Circuits Conference,* pp. 184–187.

Gomi et al., "A Sub-30psec Si Bipolar LSI Technology", *IEDM Technical Digest,* (1988) pp. 744–747.

Takemura et al., "BSA Technology for Sub-100 mn Deep Base Bipolar Transistors", *IEDM Technical Digest (1987), pp. 375–377.*

Chiu, et al., "A Bird's Beak Free Local Oxidation Technology Feasible to VSLI Circuits Fabrication", *IEEE Transactions on Electron Devices,* vol. ED-29, No. 4, pp. 536–540, Apr. 1982.

Primary Examiner—Brian E. Hearn
Assistant Examiner—T. N. Quach
Attorney, Agent, or Firm—Michael A. Glenn; Robert C. Colwell; Steven P. Koda

[57] ABSTRACT

A bipolar transistor and resistor are provided. Fabrication includes using a high temperature oxide to form sidewall spacers for the transistor contacts and/or to overlay the resistor portion of the device. Deposition of the HTO is combined with dopant drive-in so that fewer total steps are required. The process is compatible with MOS technology so that the bipolar transistor and resistor can be formed on a substrate along with MOS devices.

5 Claims, 8 Drawing Sheets

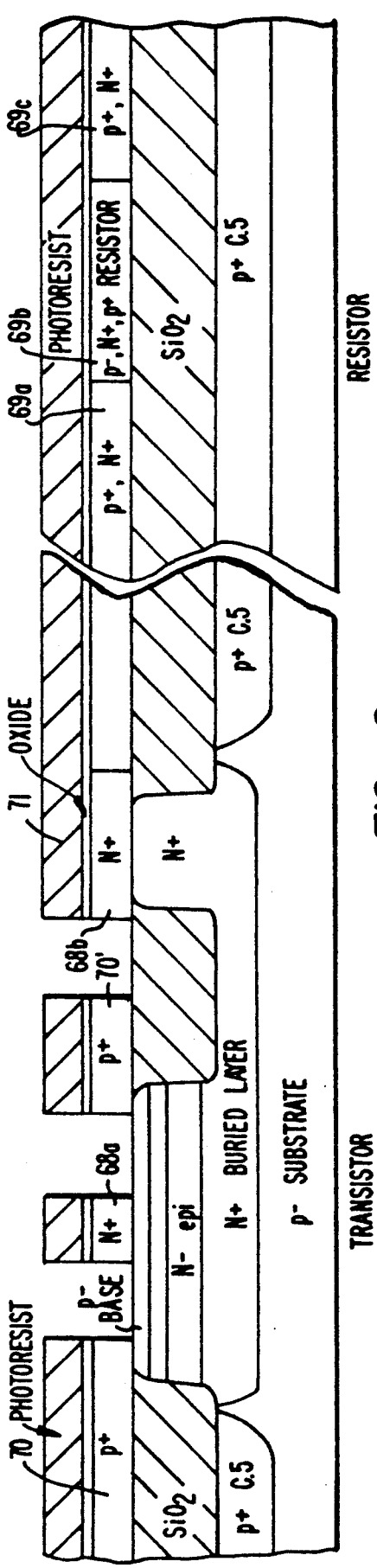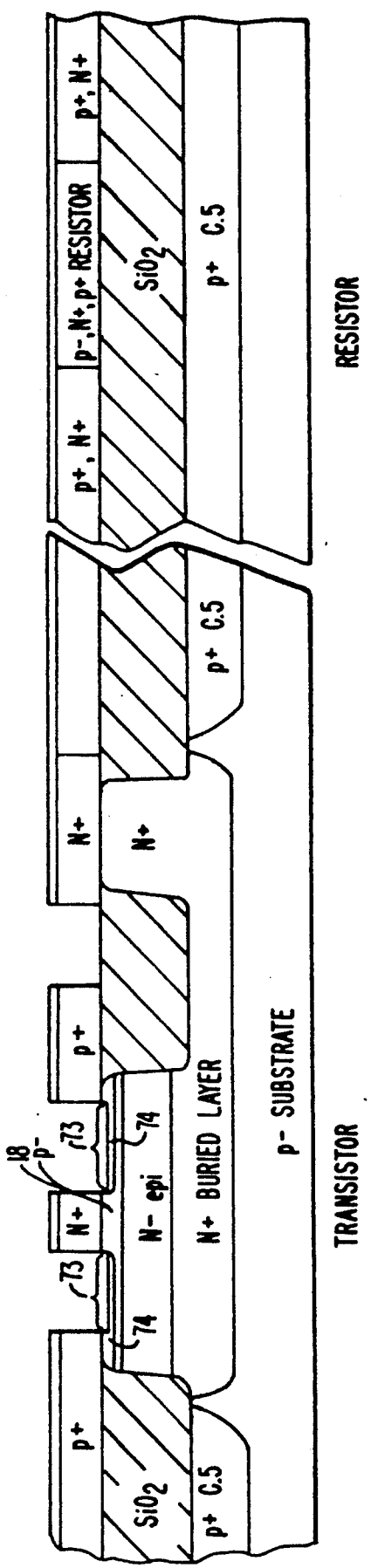
FIG. 2c.
FIG. 2d.

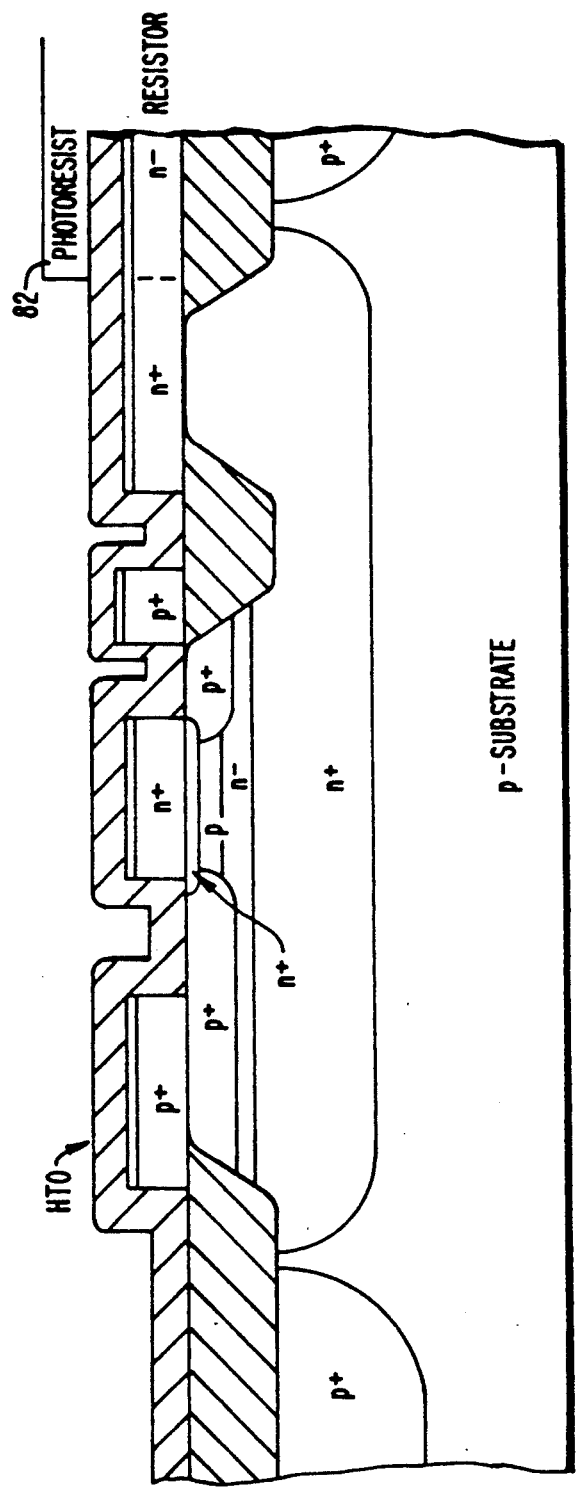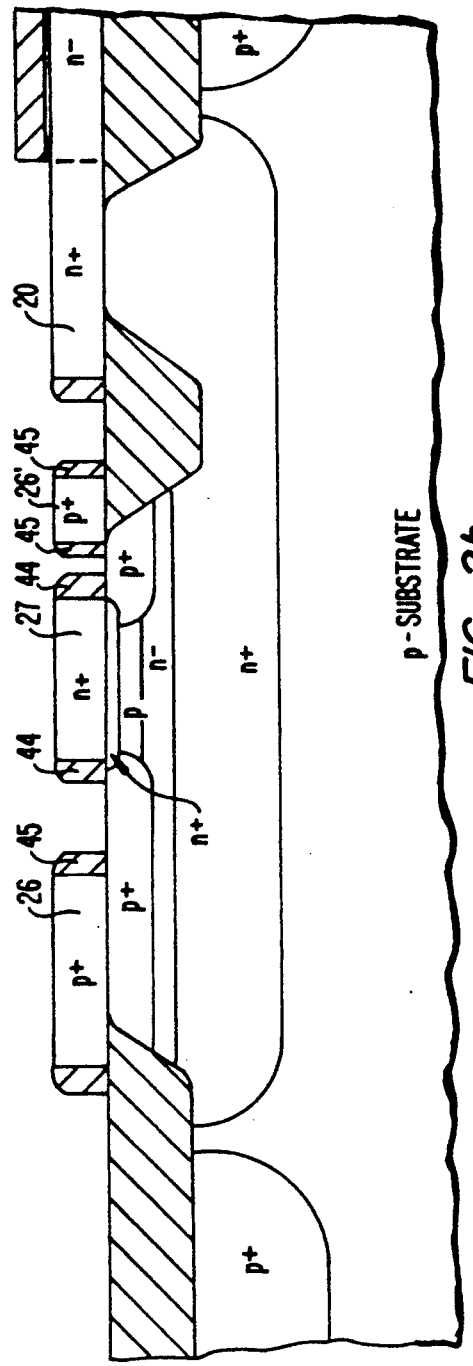

SELF-ALIGNED SILICIDED BASE BIPOLAR TRANSISTOR AND RESISTOR AND METHOD OF FABRICATION

BACKGROUND OF THE INVENTION

The present invention relates to the field of semiconductor devices and their manufacture. More specifically, in one embodiment the invention provides a bipolar transistor and a resistor on a single substrate and a process for their fabrication, using a single layer of polysilicon.

Previous methods have been available for producing transistors and resistors on a substrate. One advantageous method of producing such devices involves using a single layer of polysilicon which is selectively doped to perform the needed functions. The resulting devices can include only bipolar transistors and resistors or can include other types of devices such as CMOS devices to provide a "BiCMOS" product. BiCMOS devices offer the advantages of the high packing density and low power consumption of CMOS devices, as well as the high speed of bipolar devices. One BiCMOS device and process for fabrication thereof is described in U.S. Pat. No. 4,764,480 (Vora), assigned to the assignee of the present invention.

Previous applications of bipolar transistors and resistors using single layer polysilicon techniques have included selectively providing a layer of silicon nitride to selectively mask the resistor during subsequent processing. Previous fabrication techniques, however, have resulted in certain undesirable effects. A certain amount of the polysilicon's line width was lost during oxidation or dopant drive-in processes. Additionally, the transistor base resistance was relatively high.

SUMMARY OF THE INVENTION

The present invention includes the recognition of problems of the previous devices noted above. According to the present invention, silicon nitride is not needed in some embodiments. Rather, a high temperature oxide (HTO) is deposited and is used to form sidewall spacers for the transistor contacts and/or to overlay the resistor portion of the device. Preferably, deposition of the HTO is combined with dopant drive-in so that fewer total steps are required. Because the substrate adjacent the base is silicided, a lower base resistance is obtained. The polysilicon line width loss is lessened, since sidewall oxidation is prevented, leading to better process control. The described process is compatible with the MOS technology so that the bipolar transistor and resistor as described can be formed on a substrate with MOS devices, preferably resulting in an improved BiCMOS device.

In one embodiment the invention comprises forming a collector, buried layer, and base by selectively doping a substrate and forming a layer of polysilicon on the substrate. The polysilicon is selectively doped and etched to form emitter, base, and collector contacts and to also form a resistor. A layer of high-temperature oxide is deposited over the polysilicon and the exposed portions of the substrate at an elevated temperature. The high-temperature process causes simultaneous driving-in of dopants from the polysilicon to increase doping concentrations in the base layer. High-temperature oxide deposition takes place in the absence of a layer of nitride on the polysilicon. The deposited high-temperature oxide is selectively etched to form sidewalls adjacent the collector, emitter, and base contacts.

A further understanding of the nature and advantages of the inventions herein may be realized by reference to the remaining portions of the specification and the attached drawings.

BRIEF DESCRIPTION OF THE DRAWINGS

FIGS. 2a to 2k illustrate fabrication of a transistor-resistor device;

DESCRIPTION OF THE PREFERRED EMBODIMENTS

CONTENTS

I. General
II. Fabrication Sequence of a BiCMOS Device
III. Device Performance

I. General

Figure 1:
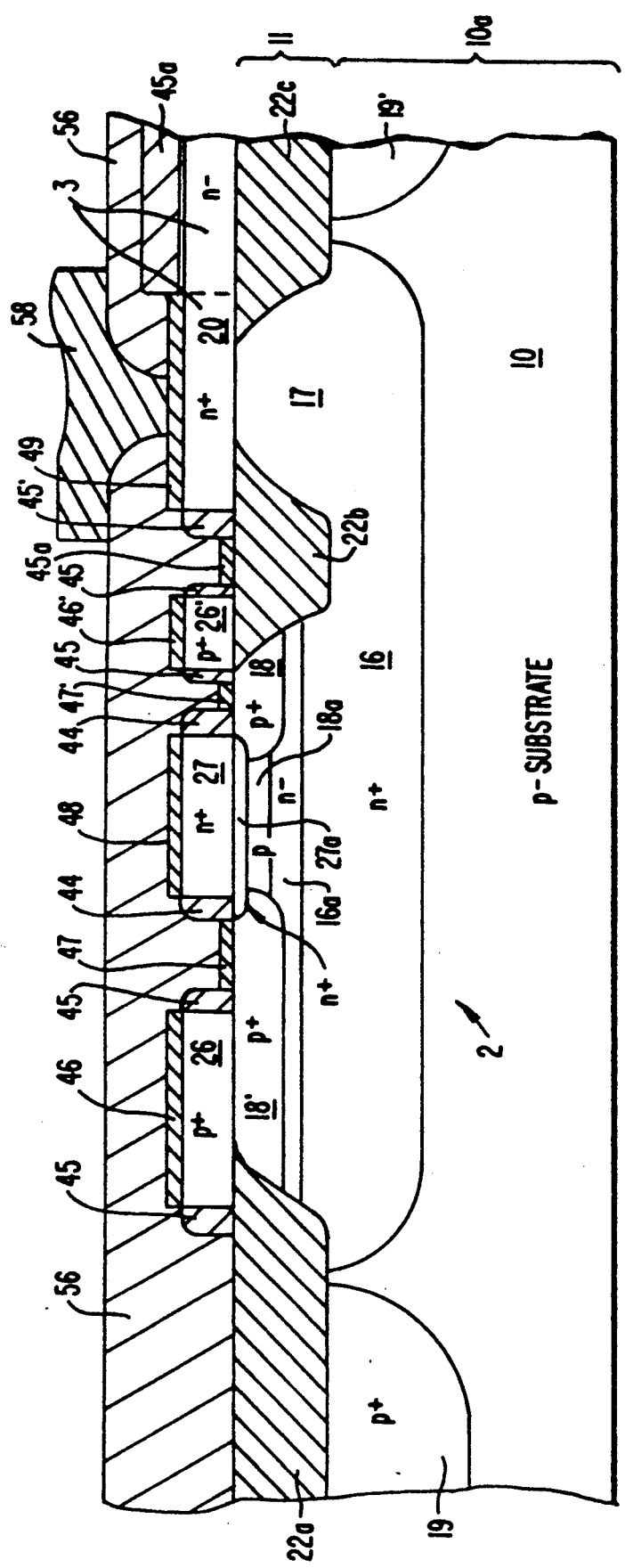
FIG. 1 is a cross-section of a transistor-resistor structure according to one embodiment of the invention.

FIG. 1 illustrates a bipolar device in cross-section according to one embodiment of the invention. The device includes a bipolar transistor 2 (which in the embodiment shown in FIG. 1 is an NPN transistor) and a resistor 3. The devices are fabricated on a substrate 10 which includes a single-crystal body 10a and an epitaxial layer 11. In the embodiment shown in FIG. 1 the single-crystal body 10a is a p− conductivity type body having a dopant concentration of between about $1 \times 10^{13}$ and $1 \times 10^{16}$ with a preferred range of between $2 \times 10^{14}$ and $3 \times 10^{15}/cm^3$. Using well-known techniques, a reduced pressure n-type epitaxial silicon layer 11 is grown on top of the single-crystal body, within which the devices are fabricated.

The NPN transistor 2 is provided with a heavily doped buried layer 16 and collector sink 17, which together provide a low resistance connection region between a collector contact 20 and the collector 16a beneath p-type base which includes p+ doped regions 18, 18' and a more lightly doped region 18a between the p+ doped regions 18, 18'. In preferred embodiments the buried layer 16 and sink 17 are doped to a concentration of between about $1 \times 10^{17}$ and $1 \times 10^{20}$ with a preferred range of about $5 \times 10^{18}$ to $1 \times 10^{20}/cm^3$. The collector 16a is a more lightly doped n-type, formed between the base region 18 and the buried layer 16. An emitter region 27a is diffused from the emitter contact 27 into the underlying epitaxial layer 11.

P+ channel stops 19, 19' are provided beneath the silicon dioxide isolation regions between the NPN transistor and adjacent devices to prevent surface inversion of the lightly doped substrate which would connect the buried layer 16 with adjacent devices. Oxide isolation regions 22a, 22b, and 22c respectively, are provided which are typically $SiO_2$ for device isolation. Viewed from the top, these silicon dioxide isolation regions form annular rings around regions of the epitaxial layer to isolate them.

Along the surface of the device are polycrystalline silicon (polysilicon) regions forming a p+ base contacts 26, 26', emitter contact 27, collector contact 20, and resistor 3. The collector contact 20 also functions as an end contact of the resistor 3. Preferably, the polysilicon regions are formed from a single layer of deposited polysilicon, as described below.

Oxide layers form sidewalls 44 for the emitter contact 27. Oxide layers also form sidewalls 45, 45' for the base and collector contacts 26, 20 and a layer 45a on the upper surface of the resistor 24. Refractory metal silicide contact 46, 46' is formed on the p+ bipolar transistor base contacts 26, 26'. Silicide 47, 47' covers the base region from the sidewalls 45 of the base contacts 26, 26' up to the sidewall oxide 44 of the emitter contact 27. A separate silicide contact 48 is provided along the top portion of the emitter 27 contact between the sidewall spacer oxide regions 44. A silicide contact 48a is provided above the field oxide region 22b between the base contact sidewall spacer 45 and the collector contact spacer 45'. Similarly, a silicide contact 49 is provided for collector contact 20. The refractory metal contacts shown herein reduce the resistivity of the adjacent polysilicon contacts and, therefore, increase the speed of the device.

The structure further includes a thick (0.8 to 1.3 and preferably about 1.3 $\mu$m) oxide layer 56 to insulate the devices from metal layer 58, used for interconnection purposes. Although the particular cross-section shown in FIG. 1 shows a metal contact 58 only for the collector contact 20, similar metal contacts, e.g. in other planes of the device can be provided for connection to the base contact 26, 26' and emitter contact 27.

II. Fabrication Sequence of BiCMOS Devices

Figure 2A:
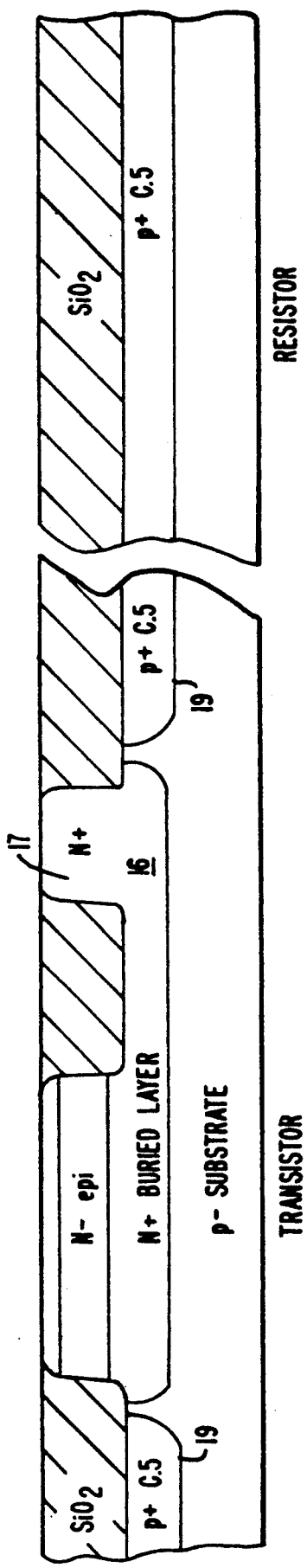

FIGS. 2a through 2n illustrate fabrication of the device shown in FIG. 1. In particular, FIG. 2a illustrates a cross-section of the devices at a first stage of their fabrication. To reach this stage, the single-crystal body 10a was masked and a dopant such as arsenic, antimony or the like, was implanted for formation of the n+ buried layer 16. The implant energy used for formation of region 16 is preferably about 100 to 200 KeV with a preferred range of between about 70 to 80 keV such that the dopant concentration of regions 14 and 16 is between about $5 \times 10^{17}$ to $2 \times 10^{20}$ with a preferred range of about $1 \times 10^{19}$ and $1 \times 10^{20}/cm^3$.

After formation of the n+ region 16, the device is then masked for formation of the p+ channel stop 19. The implant energy used in formation of the region 19 is preferably between about 100 to 200 keV with a preferred range of 50 to 150 keV such that the dopant concentration of the p+ buried layers is between about $1 \times 10^{17}$ and $1 \times 10^{18}/cm^3$. The p+ regions preferably are doped with boron.

The buried layer/channel stop mask is then removed and a doped n-type epitaxial silicon layer 11 having a thickness of about 1.1 $\mu$m is grown across the surface of the single-crystal body 10a. After depositing sandwiched layers of oxide and nitride, a photoresist mask is then formed over the surface so as to define field oxide regions 22a, 22b, and 22c. The oxide regions are formed using a modified sidewall masked isolation ("SWAMI") process. The SWAMI process is described in, e.g., Chin, et al. *IEEE Transactions on Electron Devices*, Vol ED-29, No. 4, April, 1982, pp. 536-540. In some embodiments, the process is modified as described in copending application Ser. No. 07/502,943 incorporated by reference. The substrate is then oxidized in a high pressure oxidation environment to grow the necessary field oxide.

Thereafter, a grown screen oxide layer having a thickness of about 250 Å is formed on the surface of the substrate preferably by thermal oxidation and a mask is formed, exposing only the sink region 17. A sink implant using an implant energy of about 100 to 190 keV with a dose of between about $1 \times 10^{14}$ and $1 \times 10^{16}$ using phosphorus as a dopant. The resulting dopant concentration in the sink region 17 is between about $1 \times 10^{19}$ and $1 \times 10^{20}/cm^3$. The sink and n-well are then annealed and driven-in by heating with a conventional thermal cycle in nitrogen.

Figure 2B:
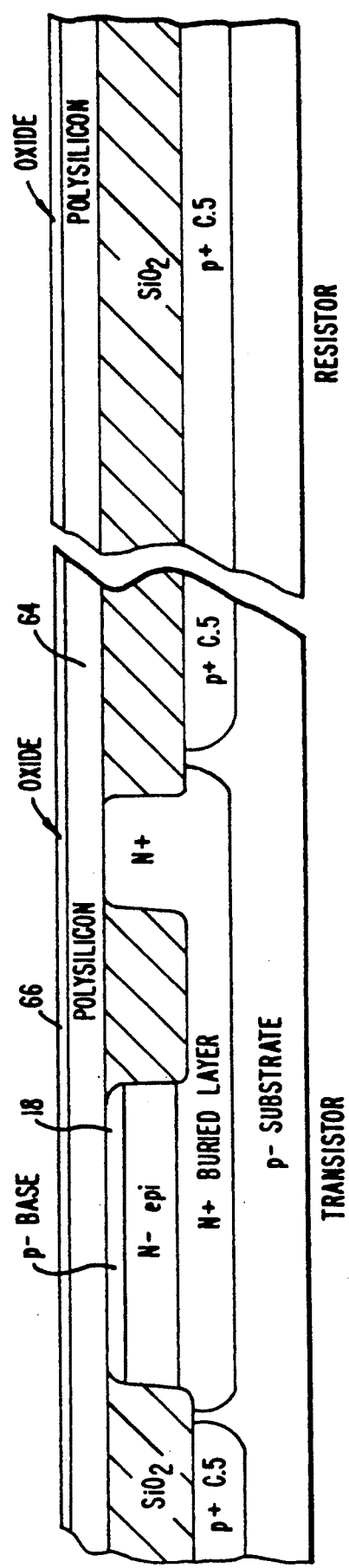

FIG. 2b illustrates the next sequence of process steps. A layer of intrinsic polysilicon 64 having a thickness of about 1,000 to 4,000 and preferably about 3,200 Å is deposited across the surface of the substrate and a cap oxide layer 66 is formed by thermal oxidation of the polysilicon layer 64. The devices are then masked with photoresist to expose at least regions which will become the base region of the bipolar transistor and the lightly doped regions of the resistors. A base implant is then performed and the base is annealed. In preferred embodiments the base implant uses an energy of between about 30 and 100 KeV, with an implant energy of between about 30 and 50 KeV preferred. The dose of this implant is preferably between about $3 \times 10^{13}$ and $8 \times 10^{13}$. In preferred embodiments the anneal is performed by heating the structure to 950° C. for 45 minutes, and results in a p- base region 18 having a thickness of between about 1,000 and 2,000 Å with a dopant concentration of between about $1 \times 10^{18}$ and $1 \times 10^{19}/cm^3$, with a dopant concentration of about $5 \times 10^{18}/cm^3$ preferred.

Thereafter, a mask is formed which exposes at least regions 70, 70' (FIG. 2c) which will eventually be portions of the base contacts. The regions are preferably doped p+ using boron to a concentration of between about $1 \times 10^{19}$ and $1 \times 10^{20}/cm^3$ with a dopant concentration of about $6 \times 10^{19}/cm^3$ preferred. The p+ mask is removed and another mask is formed on the surface of the device to expose at least regions 68a and 68b which eventually will be used as the bipolar emitter, and the bipolar collector contacts. The regions 68 are doped n+ using an arsenic implant with an energy of about 100 keV to a concentration of between about $5 \times 10^{19}$ and $1 \times 10^{20}/cm^3$. The regions which will become the resistor and adjacent polysilicon 69a, 69b, 69c may be either n+ or p+ and thus may be included in either the n+ or p+ mask.

Next, a photoresist mask 71, is formed on the surface of the oxide to define the base, emitter, and collector of the bipolar transistor and the resistor. A dry etch with chlorine chemistry results in the structure shown in FIG. 2c. As shown, the etch is conducted such that the exposed bipolar base regions (extrinsic base) 73 are etched below the original epitaxial surface by about 1000 to 2000 Å to reduce emitter/base capacitance in the bipolar transistors. FIG. 2d shows the configuration of the device following such an etch, and after removal of the photoresist.

A p-type LDD using a dopant such as BF$_2$ is performed across the surface of the bipolar transistor with the base region 73 of the bipolar transistor exposed by a mask. A more heavily doped p-region 74 which will be self-aligned to the emitter is formed in the base 18 of the bipolar transistor. The resulting net dopant concentration in the region 74 is between about $5 \times 10^{17}$ and $1 \times 10^{19}/cm^3$. The implant energy is preferably between about 40 and 60 KeV.

In some cases, it is desired to grow a thin (about 100 Å) layer (not shown) of SiO$_2$ over the surface of the device. Such a layer is particularly useful when the HTO (described below) is of a low quality. In the alternative, the HTO, deposited as described below, can be treated to improve its quality.

Figure 2E:
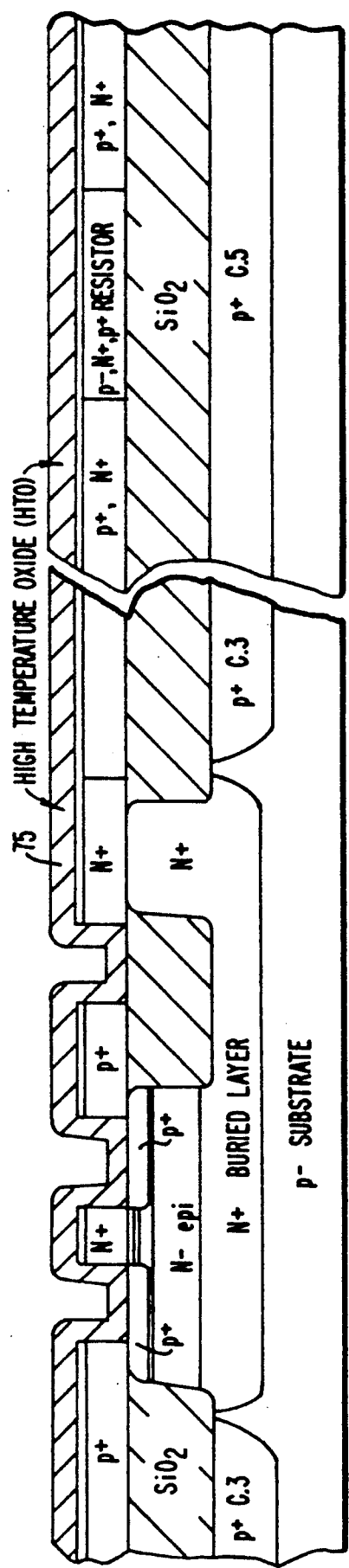
Figure 2F:
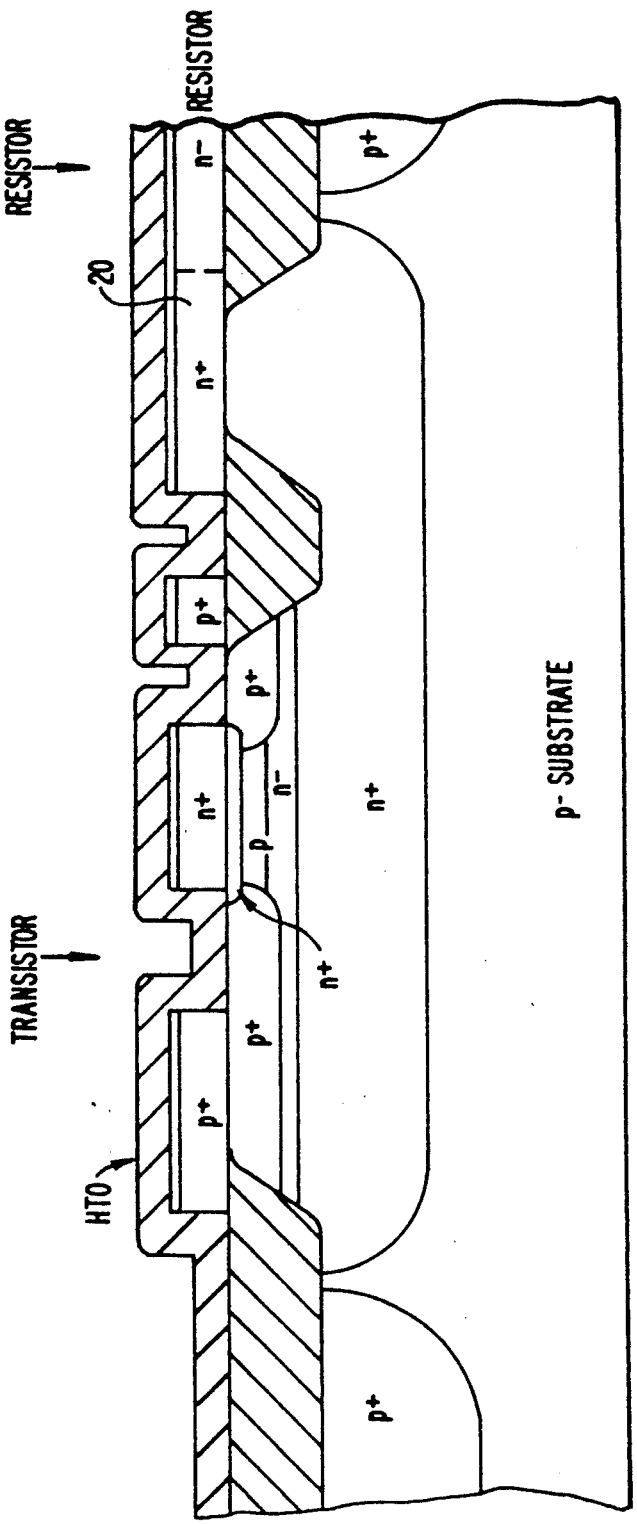

As shown in FIG. 2e, a high temperature oxide (HTO) layer 75 is next deposited using methods well known in the art. The high temperature oxide is a silicon oxide and is preferably about 2,000 to 3,000 Å thick. HTO deposition is conducted at an elevated temperature of about 825° to 850° C. Preferably, HTO deposition is done simultaneously with dopant drive-in which is caused by the high-temperature processing used during HTO deposition. By combining HTO deposition with dopant drive-in, a simpler process results because fewer steps are required. Furthermore, because, as described below, the HTO is used both to provide sidewall spacers and to protect the resistor during further processing, the process is further simplified compared to previous processes which use an oxide material for sidewall spacers but require a separate nitride layer for masking areas other than the resistor 3. Although, as noted above, the resistor 3 can be an n type or a p type resistor, FIGS. 2f-2k depict one preferred embodiment in which the resistor is an n− resistor and is formed adjacent to the collector contact 20.

Referring to FIG. 2g, a photoresist silicide exclusion mask 82 is formed on the device on polysilicon regions where silicide formation is not desired (e.g., over the center portion of the resistor). The oxide is then etched back, leaving spacer oxide 44, 45 on exposed sides of the emitter contact 27, base contacts 26, 26', and collector contact 20 using means known to those of skill in the art, to produce the configuration of FIG. 2h.

Figure 2I:
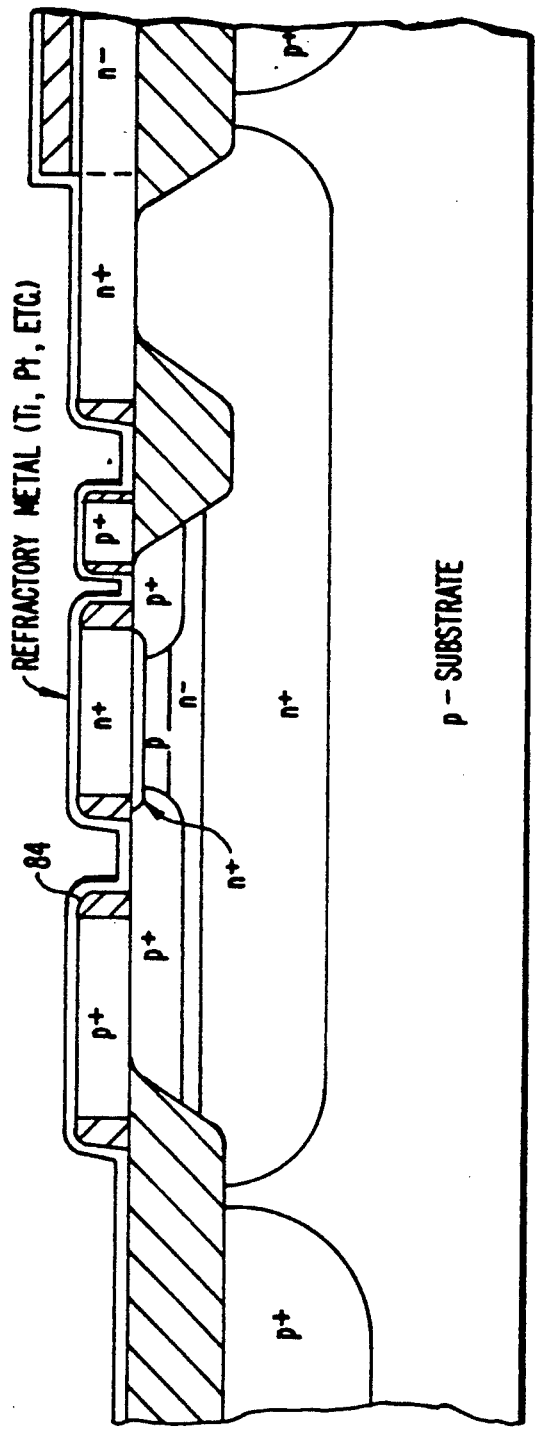
Figure 2J:
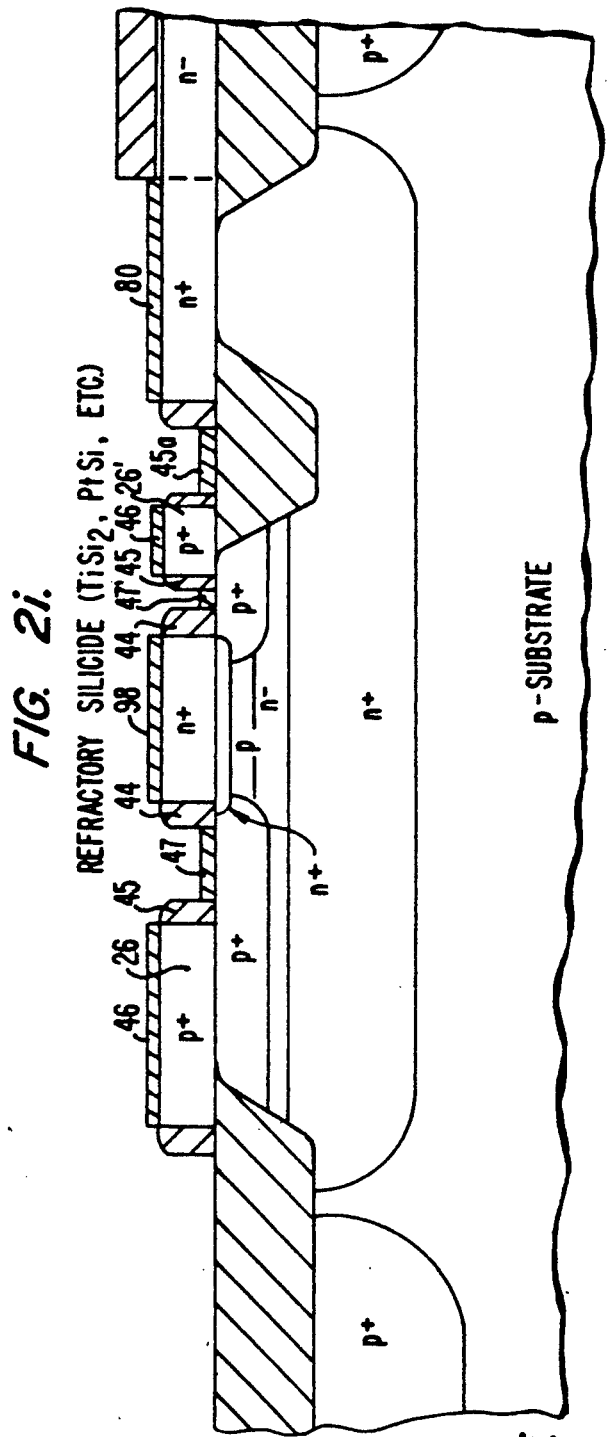

Next, a layer of refractory metal 84 such as titanium, molybdenum, tantalum, tungsten, or the like, is deposited across the surface of the device (FIG. 2i). Using means well known to those of skill in the art, the layer is heated to about 750° C. for about 10 seconds, preferably using a rapid thermal anneal (RTA). The heating results in the formation of metal silicide in regions where the deposited metal is in contact with polysilicon. Remaining unreacted metal is then etched away from the device, e.g., using $H_2O_2$ or $NH_3OH$, leaving a structure as shown in FIG. 2j. As shown therein, the bipolar polysilicon base contacts 26, 26' are covered with silicide 46 across their horizontal upper surfaces. The silicide layer reduces resistivity of the base contact and increases the speed of the device. In addition, silicide contacts 47, 47' extend along the horizontal upper surface of the exposed base from the collector contact sidewalls 45 fully up to the emitter contact sidewall oxide 44. The silicide contact 98 of the emitter extends across the horizontal upper surface of the emitter from one sidewall oxide 44 to the opposite sidewall oxide 44. The silicide 80 on the collector contact 20 extends across the horizontal upper surface of the collector contact 20.

Figure 2K:
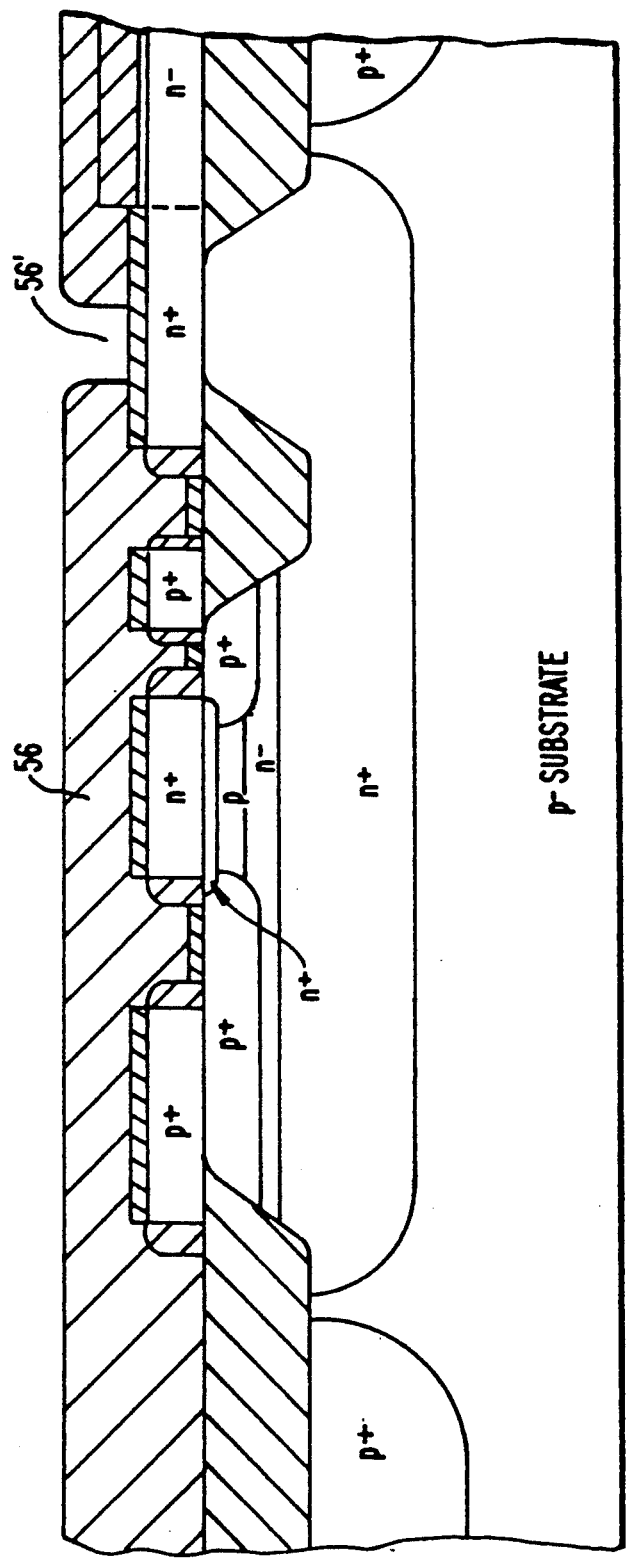

FIG. 2k illustrates the next step in the fabrication sequence in which an oxide layer 56 is deposited and masked to form contact holes 56' therein. Metal is deposited on the surface of the device, masked, and etched from selected regions, providing the device shown in FIG. 1.

The present process minimizes loss of polysilicon line width by reducing sidewall oxidation which tended to erode the polysilicon sidewall and thus reduce line width. Furthermore, by providing for a silicide layer in the extrinsic base region, the base resistance is lowered leading to higher performance in the transistors. The described process is compatible with MOS technologies and thus the described bipolar device and resistor can be formed simultaneously with formation with MOS devices, for example to produce BiCMOS devices.

III. Device Performance

Figure 3:
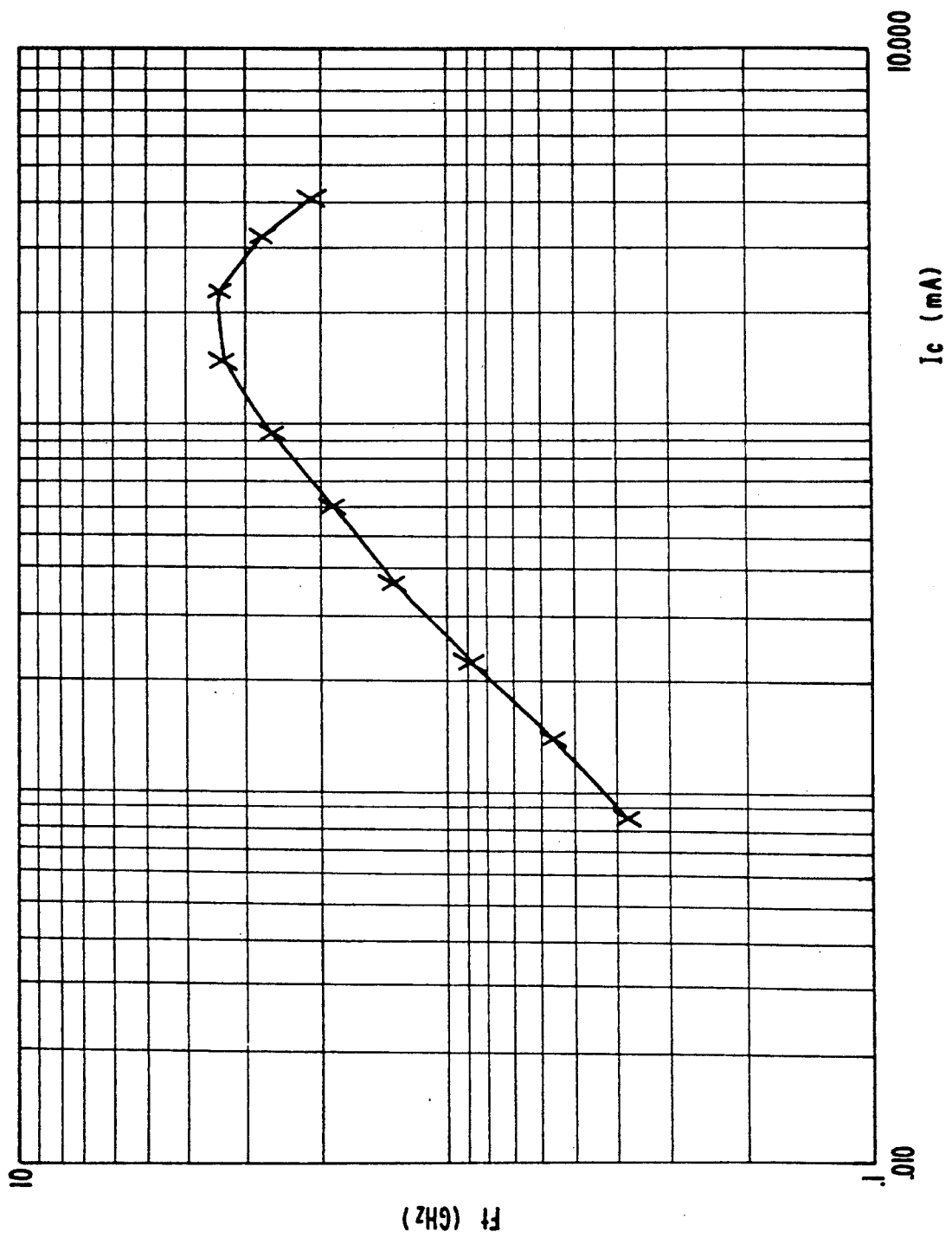
FIG. 3 illustrates $I_c$ versus frequency for a bipolar transistor according to one embodiment of the invention.

FIG. 3 depicts certain performance characteristics of a bipolar device produced as described above. FIG. 3 shows the collector current in milliamps over a frequency range from 374.6 MHz to 346.69 MHz. FIG. 3 demonstrates that a device formed as described herein produces a functional transistor.

It is to be understood that the above description is intended to be illustrative and not restrictive. Many variations of the invention will become apparent to those of skill in the art upon review of this disclosure. Merely by way of example particular regions of the devices shown herein have been illustrated as being p-type or n-type, but it will be apparent to those of skill in the art that the role of n- and p-type dopants may readily be reversed. Further, while the invention has been illustrated with regard to specific dopant concentrations in some instances, it should also be clear that a wide range of dopant concentrations may be used for many features of the devices herein without departing from the scope of the inventions herein. Still further, while the inventions herein have been illustrated primarily in relation to a bipolar device, many facets of the invention could be applied in the fabrication of MOSFETs, BiCMOS or other devices in combination with the disclosed device. The scope of the invention should, therefore, be determined not with reference to the above description, but instead should be determined with reference to the appended claims along with their full scope of equivalents.

What is claimed is:

1. A method for producing a bipolar transistor and a resistor on a substrate, comprising the steps of:
   selectively doping portions of said substrate to provide a buried layer, a collector layer, and a base layer overlying the collector layer;
   depositing a layer of polysilicon on said substrate;
   selectively doping and etching portions of said polysilicon layer to form emitter, base and collector contacts and a resistor;
   depositing a layer of high-temperature oxide over said polysilicon and exposed portions of said substrate at an elevated temperature, while simultaneously driving-in dopants from said polysilicon to increase doping concentrations in said base layer, said depositing taking place in the absence of a layer overlying said polysilicon;
   selectively etching said high temperature oxide to form sidewall spacers adjacent said collector, emitter and base contacts.

2. A method, as claimed in claim 1, further comprising:
   forming a metal silicide layer at least on the upper surfaces of said collector, emitter and base contacts and contacting said substrate adjacent said base region.

3. A method for producing a bipolar transistor and a resistor on a substrate, comprising the steps of:
   selectively doping portions of said substrate to provide a buried layer, a collector layer, and a base layer overlying the collector layer;
   depositing a layer of polysilicon on said substrate;

selectively doping and etching portions of said polysilicon layer to form emitter, base and collector contacts and a resistor;

depositing a layer of high-temperature oxide over said polysilicon and exposed portions of said substrate at an elevated temperature, while simultaneously driving-in dopants from said polysilicon to increase doping concentrations in said base layer, said depositing taking place in the absence of a layer of nitride overlying said polysilicon;

depositing a mask material on said high-temperature oxide in the region of said resistor; and selectively etching said high temperature oxide to form sidewall spacers adjacent said collector, emitter and base contacts, said masked material for maintaining the layer of high-temperature oxide over said resistor during selective etching of said high-temperature oxide.

4. A method, as claimed in claim 3, further comprising:

forming a metal silicide layer in regions not overlain by high temperature oxide wherein said sidewalls of said contacts and said resistor remain free of metal silicide.

5. A method for producing a bipolar transistor and resistor on a substrate, comprising:

selectively doping portions of said substrate to provide a collector layer, a buried layer, and a base layer overlying the collector layer;

depositing a layer of polysilicon on said substrate;

selectively doping and etching portions of said polysilicon layer to form emitter, base, and collector contacts and a resistor;

depositing a layer of high-temperature oxide over said polysilicon and exposed portions of said substrate at an elevated temperature, while simultaneously driving-in dopants from said polysilicon to increase doping concentrations in said base layer, said depositing taking place in the absence of a layer of nitride overlying said polysilicon;

depositing a masked material on said high-temperature oxide in the region of said resistor, to maintain a layer of high temperature oxide over said resistor;

selectively etching said high-temperature oxide to form sidewalls spacers adjacent said collector and base contacts; and forming a metal silicide layer on at least the upper surfaces of said collector, emitter, and base contacts and on said substrate adjacent to said base, wherein said sidewalls of said contacts and at least a portion of said resistor remain free of metal silicide.

* * * * *